United States Patent
Jackson

(10) Patent No.: US 12,483,193 B2
(45) Date of Patent: Nov. 25, 2025

(54) ENSEMBLE OF MEMS OSCILLATORS IN A HIGHLY ACCURATE AND RESILIENT CLOCK SYSTEM

(71) Applicant: Viavi Solutions, Inc., San Jose, CA (US)

(72) Inventor: Gregor Said Jackson, Las Vegas, NV (US)

(73) Assignee: Viavi Solutions, Inc., Chandler, AZ (US)

( * ) Notice: Subject to any disclaimer, the term of this patent is extended or adjusted under 35 U.S.C. 154(b) by 18 days.

(21) Appl. No.: 18/420,058

(22) Filed: Jan. 23, 2024

(65) Prior Publication Data

US 2025/0239971 A1 Jul. 24, 2025

(51) Int. Cl.
*H03B 5/04* (2006.01)
*H03B 5/32* (2006.01)
*H03B 5/36* (2006.01)
*H03K 5/135* (2006.01)
*H03L 1/02* (2006.01)

(52) U.S. Cl.
CPC .............. *H03B 5/366* (2013.01); *H03B 5/04* (2013.01); *H03K 5/135* (2013.01); *H03L 1/028* (2013.01); *H03B 2202/05* (2013.01)

(58) Field of Classification Search
CPC ... H03B 5/04; H03B 5/30; H03B 5/32; H03B 5/36; H03B 5/366; H03B 2202/05; H03L 1/02; H03L 1/022; H03L 1/028
See application file for complete search history.

(56) References Cited

U.S. PATENT DOCUMENTS

| 8,195,397 | B2 * | 6/2012 | Blanz | H03B 5/32 |
| | | | | 702/6 |
| 8,581,670 | B2 * | 11/2013 | Akaike | H03L 1/026 |
| | | | | 331/116 R |
| 10,361,704 | B2 * | 7/2019 | Yorita | H03L 7/24 |
| 10,992,301 | B1 * | 4/2021 | Mitric | H03L 7/0994 |
| 11,456,751 | B1 * | 9/2022 | Bahr | H03L 7/06 |
| 2010/0117750 | A1 * | 5/2010 | Fry | H03H 9/02086 |
| | | | | 331/162 |
| 2012/0043999 | A1 * | 2/2012 | Quevy | H03L 7/18 |
| | | | | 327/147 |

(Continued)

*Primary Examiner* — Levi Gannon
(74) *Attorney, Agent, or Firm* — Farjami & Farjami LLP

(57) ABSTRACT

Disclosed is a clock system for generating an error-reduced clock output. In one implementation, the clock system includes a plurality of physical clusters of MEMS oscillators that provide a set of associated clock inputs to a processor. The processor performs RMS error correction and/or Kalman filtering and/or Bayesian particle filtering to generate an oscillator control output to adjust a frequency of a controlled MEMS oscillator to generate the error-reduced clock output. In another implementation, the processor configures the MEMS oscillators into a dynamic plurality of logical clusters instead of relying on a plurality of physical clusters. The processor performs RMS error correction and/or Kalman filtering and/or Bayesian particle filtering to generate an oscillator control output to adjust a frequency of a controlled MEMS oscillator to generate the error-reduced clock output. Also disclosed are techniques for compensating for errors related to temperature drift, tilt, and age drift of the MEMS oscillators.

20 Claims, 6 Drawing Sheets

(56) References Cited

U.S. PATENT DOCUMENTS

| | | | |
|---|---|---|---|
| 2013/0033332 A1* | 2/2013 | Akaike | H03L 1/022 |
| | | | 331/70 |
| 2014/0132361 A1* | 5/2014 | Yorita | H05B 1/023 |
| | | | 219/505 |
| 2021/0041576 A1* | 2/2021 | Jackson | G01S 19/32 |
| 2021/0265999 A1* | 8/2021 | Degani | H03L 7/081 |
| 2025/0047290 A1* | 2/2025 | Liu | H03L 7/24 |

* cited by examiner

ENSEMBLE OF MEMS OSCILLATORS IN A HIGHLY ACCURATE AND RESILIENT CLOCK SYSTEM

BACKGROUND

There are numerous critical applications that require extreme accuracy and stability of the system clock, and precise synchronization with a reference clock. For example, clock accuracy, stability and synchronization are critical for national time standards, telecommunication networks, scientific research, geophysics, financial markets, cryptography, space exploration, and for receiving and processing information from Global Navigation Satellite System (GNSS), such as Global Positioning Satellites (GPS).

Presently, atomic clocks are used in systems that require extreme accuracy, stability and synchronization. However, atomic clocks are very expensive.

MEMS (microelectromechanical system) oscillators are much less expensive than atomic clocks. However, although some MEMS oscillators have demonstrated great accuracy and stability, they have not been widely adopted to replace atomic clocks since MEMS oscillators are generally not as accurate and stable as atomic clocks.

Accordingly, there is need in the art for a robust system clock that is at least as accurate and stable as atomic clocks, but significantly less expensive.

SUMMARY

The present disclosure is directed to an ensemble of MEMS oscillators in a highly accurate and resilient clock system, substantially as shown in and/or described in connection with at least one of the figures, and as set forth in the claims.

DETAILED DESCRIPTION

Figure 1:
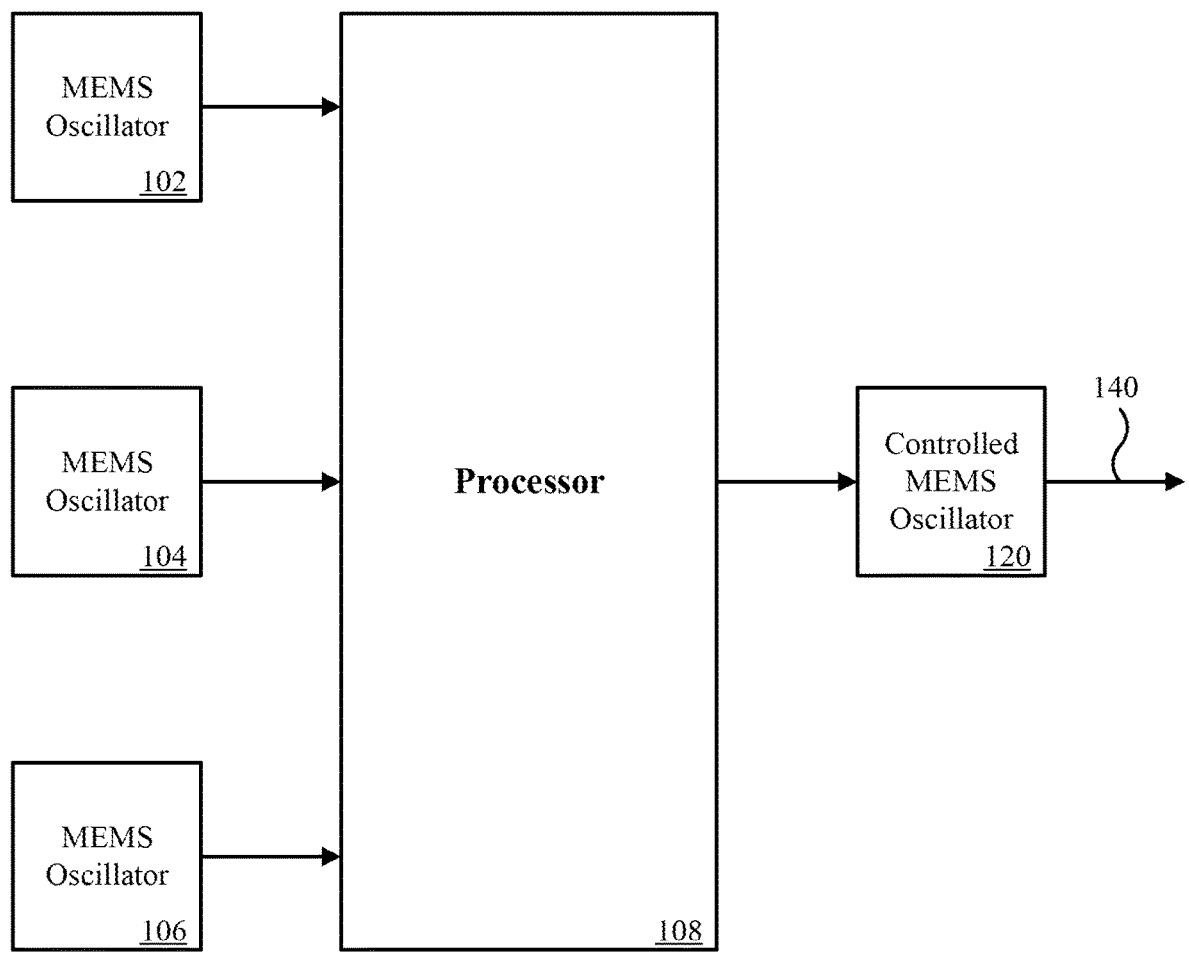
FIG. 1 shows a clock system comprising a processor and an ensemble of MEMS oscillators that form a three-cornered hat configuration.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Recent MEMS oscillators have demonstrated high accuracy and stability, such as very low age drift. For example, an accuracy of significantly below one microsecond of error over 48 hours of operation has been measured. One implementation of the present application is a clock system comprising an ensemble of inexpensive MEMS oscillators and a processor. One example of such clock system is shown in FIG. 1. MEMS oscillators 102, 104, and 106 form a three-cornered hat. The clock output of each of the three MEMS oscillators 102, 104, and 106 is fed into processor 108. In this implementation, the three-cornered hat configuration of the MEMS oscillators can be used to significantly reduce error in establishing a precise time by various techniques such as by a root mean square error (RMSE) correction technique, a Kalman filtering error correction technique, or a particle filtering method, such as a Bayesian particle filtering method, implemented by processor 108.

In a root mean square error correction technique, the square root of the mean (average) of the squared values of relative errors in a set of data points (e.g., oscillation frequencies of the MEMS oscillators) is determined by processor 108. The RMSE value is then used by the processor to calculate an error-corrected oscillation frequency. This error-corrected oscillation frequency is then used by processor 108 to adjust the oscillation frequency of controlled MEMS oscillator 120 to match the error-corrected frequency and to produce error-reduced clock output 140.

In a Kalman filtering technique, or a Bayesian particle filtering method, algorithms of various Kalman filters or Bayesian particle filters can be used by processor 108 to estimate an error-corrected oscillation frequency derived from the oscillation frequencies of MEMS oscillators 102, 104, and 106. This error-corrected oscillation frequency is then used by processor 108 to adjust the oscillation frequency of oscillator 120 to match the error-corrected frequency and to produce error-reduced clock output 140. In one implementation, MEMS oscillator 120 does not have to be as accurate and as costly as MEMS oscillators 102,104, and 106 since MEMS oscillator 120 is controlled by processor 108.

Figure 2:
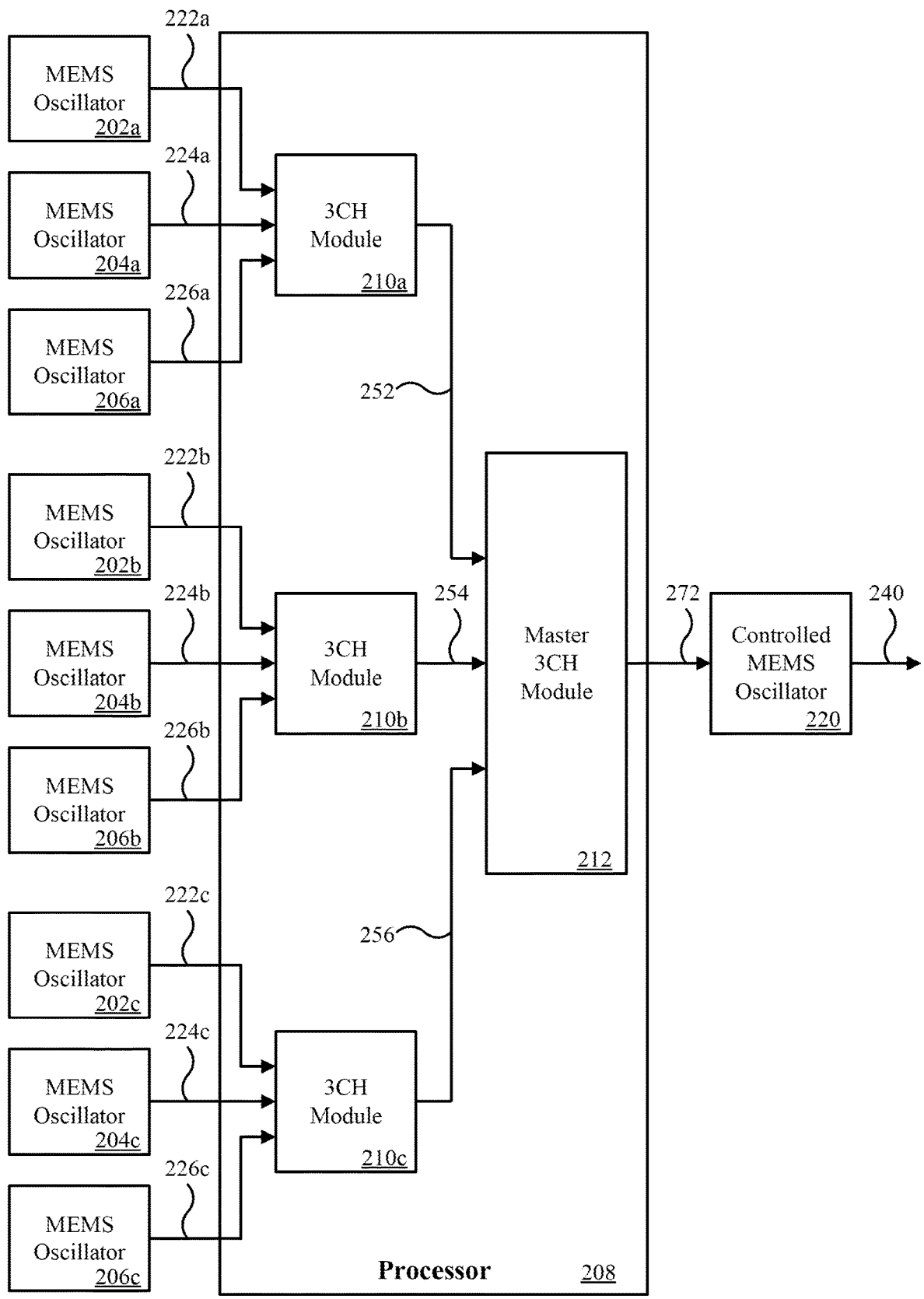
FIG. 2 shows another clock system comprising a processor and an ensemble of MEMS oscillators that result in four sets of three-cornered hats.

FIG. 2 shows another implementation of a clock system that comprises an ensemble of physical clusters of MEMS oscillators physically configured as sets of three-cornered hats and a processor. A first set of three-cornered hat comprises MEMS oscillators 202a, 204a, and 206a that provide respective clock inputs 222a, 224a, and 226a to processor 208 and feed into 3CH module 210a in processor 208. A second set of three-cornered hat comprises MEMS oscillators 202b, 204b, and 206b that provide respective clock inputs 222b, 224b, and 226b to processor 208 and feed into 3CH module 210b in processor 208. A third set of three-cornered hat comprises MEMS oscillators 202c, 204c, and 206c that provide respective clock inputs 222c, 224c, and 226c to processor 208 and feed into 3CH module 210c in processor 208. 3CH module 210a applies a root mean square error (RMSE) correction technique or a Kalman filtering error correction technique or a Bayesian particle filtering method to clock inputs 222a, 224a, and 226a received from their associated MEMS oscillators 202a, 204a, and 206a to provide interim clock output 252 to master 3CH module 212. Similarly, 3CH module 210b applies a root mean square error (RMSE) correction technique or a Kalman filtering error correction technique or a Bayesian particle filtering method to clock inputs 222b, 224b, and 226b received from their associated MEMS oscillators 202b, 204b, and 206b to provide interim clock output 254 to master 3CH module 212. Likewise, 3CH module 210c applies a root mean square error (RMSE) correction technique or a Kalman filtering error correction technique or a Bayesian particle filtering method to clock inputs 222c, 224c, and 226c received from their associated MEMS oscillators 202c, 204c, and 206c to provide interim clock output 256 to master 3CH module 212.

Thus, 3CH modules 210a, 210b, and 210c provide respective interim clock outputs 252, 254, and 256 to master 3CH module 212. Master 3CH module 212 in processor 208 in turn applies a root mean square error (RMSE) correction technique or a Kalman filtering error correction technique or a Bayesian particle filtering method to interim clock outputs 252, 254, and 256 to generate oscillator control output 272 to control and adjust the oscillation frequency of controlled MEMS oscillator 220. Thus, in the implementation of FIG. 2, a total of nine MEMS oscillators 202a, 204a, 206a, 202b, 204b, 206b, 202c, 204c, and 206c result in a total of four sets of three-cornered hats.

In this implementation, the four three-cornered hat configurations of the MEMS oscillators can be used to significantly reduce error in establishing a precise time by various techniques such as by a root mean square error (RMSE) correction technique or a Kalman filtering technique or a Bayesian particle filtering method implemented by processor 208. The RMSE value is used by the processor to calculate an error-corrected oscillation frequency. This error-corrected oscillation frequency is used by processor 208 to adjust the oscillation frequency of controlled MEMS oscillator 220 to match the error-corrected frequency. Similarly, algorithms of various Kalman filters or Bayesian particle filters can be used by processor 208 to estimate an error-corrected oscillation frequency derived from the oscillation frequencies of MEMS oscillators 202a, 204a, 206a, 202b, 204b, 206b, 202c, 204c, and 206c configured as four sets of three-cornered hats. This error-corrected oscillation frequency is used by processor 208 to adjust the oscillation frequency of controlled MEMS oscillator 220 to match the error-corrected frequency and to produce error-reduced clock output 240. In one implementation, MEMS oscillator 220 does not have to be as accurate and as costly as MEMS oscillators 202a, 204a, 206a, 202b, 204b, 206b, 202c, 204c, and 206c since MEMS oscillator 220 is controlled by processor 208.

The implementation in FIG. 2 results in at least a three times (3×) improvement in accuracy of the resulting clock signal generated by controlled MEMS oscillator 220. The ten MEMS oscillators 202a, 204a, 206a, 202b, 204b, 206b, 202c, 204c, 206c, and 220 fit in approximately the same packaging form factor that houses a typical atomic clock, while having a greater accuracy than a typical atomic clock, and costing less than a comparably accurate atomic clock. It is noted that with physical clusters, an example of which is shown in FIG. 2, three processors (one for each cluster of three MEMS oscillators) may be a preferred implementation because time capturing nine different oscillator outputs with a single processor may require complex circuitry.

Figure 3:
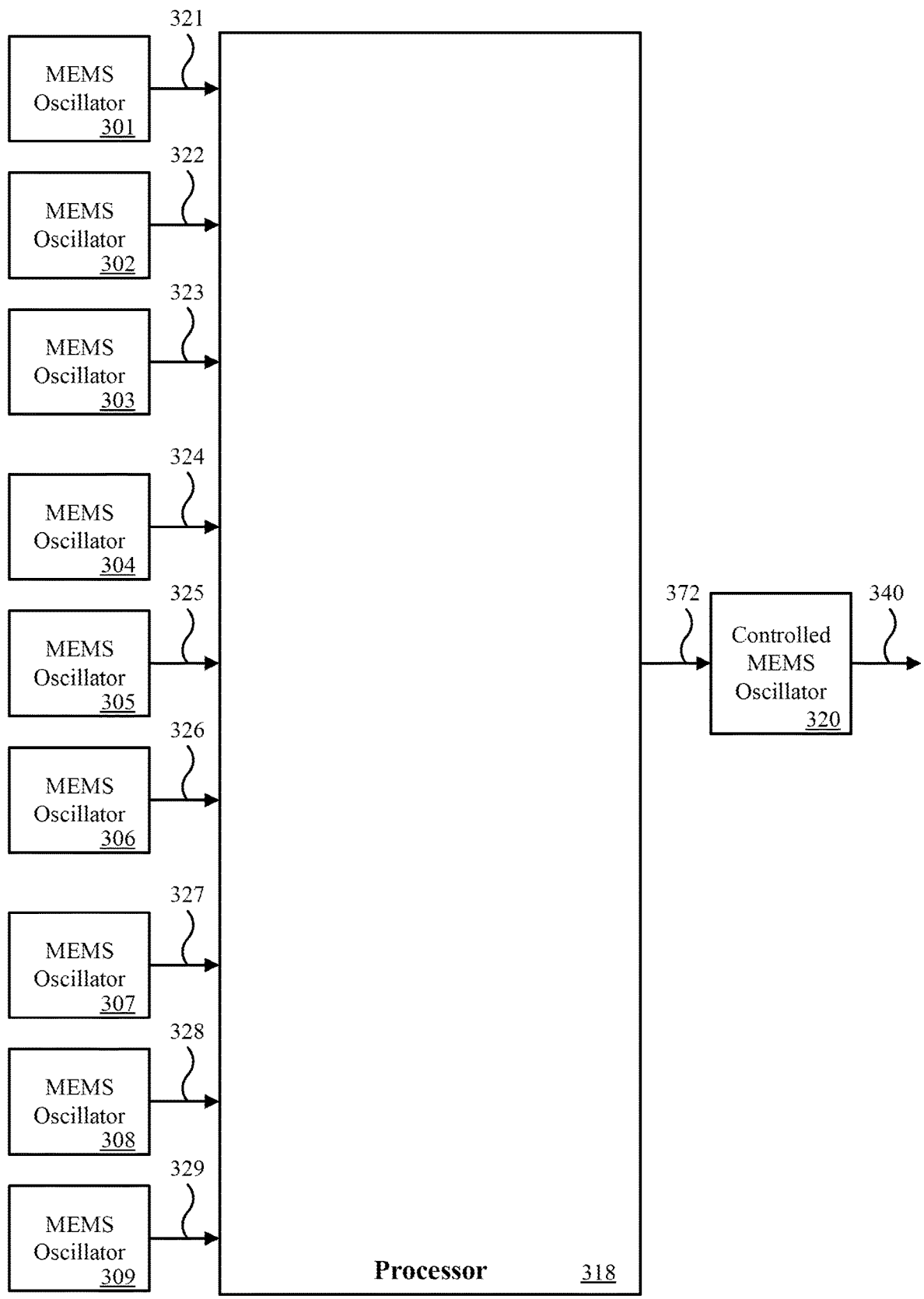
FIG. 3 shows another clock system comprising a processor and an ensemble of MEMS oscillators that are logically and dynamically clustered by a processor.

In one implementation of the present application's clock system, the nine MEMS oscillators 202a, 204a, 206a, 202b, 204b, 206b, 202c, 204c, and 206c of FIG. 2 can be arranged logically instead of physically. FIG. 3 shows such an arrangement where nine MEMS oscillators 301, 302, 303, 304, 305, 306, 307, 308, and 309 provide respective clock inputs 321, 322, 323, 324, 325, 326, 327, 328, and 329 that are fed into processor 318 without the MEMS oscillators being physically arranged into clusters of three oscillators, as was the case in FIG. 2. The nine clock inputs 321, 322, 323, 324, 325, 326, 327, 328, and 329 can be dynamically and logically associated in a reconfigurable arrangement of three clusters of three-cornered hat ensemble of oscillators. Moreover, instead of three-cornered hat clusters that were physically fixed in FIG. 2, it is possible to logically and dynamically associate four or more of the MEMS oscillators with each other as clusters of oscillators in the clock system of FIG. 3.

In the implementation of FIG. 3, the dynamic configuration of logical clusters of three-cornered hats of MEMS oscillators (or even clusters of four or more MEMS oscillators) can be used to significantly reduce error in establishing a precise time by various techniques such as by a root mean square error (RMSE) correction technique or a Kalman filtering error correction technique or a Bayesian particle filtering method implemented by processor 318. The RMSE value is then used by the processor to calculate an error-corrected oscillation frequency. This error-corrected oscillation frequency is used by processor 318 to generate oscillator control output 372 to control and adjust the oscillation frequency of controlled MEMS oscillator 320 to generate error-reduced clock output 340. Similarly, algorithms of various Kalman filters or Bayesian particle filters can be used by processor 318 to estimate an error-corrected oscillation frequency derived from the oscillation frequencies of MEMS oscillators 301, 302, 303, 304, 305, 306, 307, 308, and 309 configured as sets of three-cornered hats (or as sets of four or more MEMS oscillators). This error-corrected oscillation frequency is used by processor 318 to control the oscillation frequency of oscillator 320 to match the error-corrected frequency and to produce the error-reduced clock output 340. In one implementation, MEMS oscillator 320 does not have to be as accurate and as costly as MEMS oscillators 301, 302, 303, 304, 305, 306, 307, 308, and 309 since MEMS oscillator 320 is controlled by processor 318. The logical, instead of physical configuration, of a cluster of oscillators provides various advantages that are discussed in more detail below.

The clustering techniques described in relation to FIGS. 1 through 3 work well to correct errors by clustering MEMS oscillators where the errors are generally gaussian errors, i.e., the errors are not correlated, for example when the errors are due to variations in manufacturing processes or materials used in the MEMS oscillators. For errors in the generated frequency of MEMS oscillators that tend to be somewhat correlated, in addition to the three-cornered hat (or higher number) clustering techniques described above, other error correction techniques can be employed. Errors that tend to be correlated include changes in oscillation frequency due to age drift, temperature drift, and "tilt," i.e., when the physical orientation of all the MEMS oscillators on a printed circuit board (PCB) or in the same package changes in the same way due to being moved or accelerated by an external force such as gravity or other acceleration force.

Figure 4A:
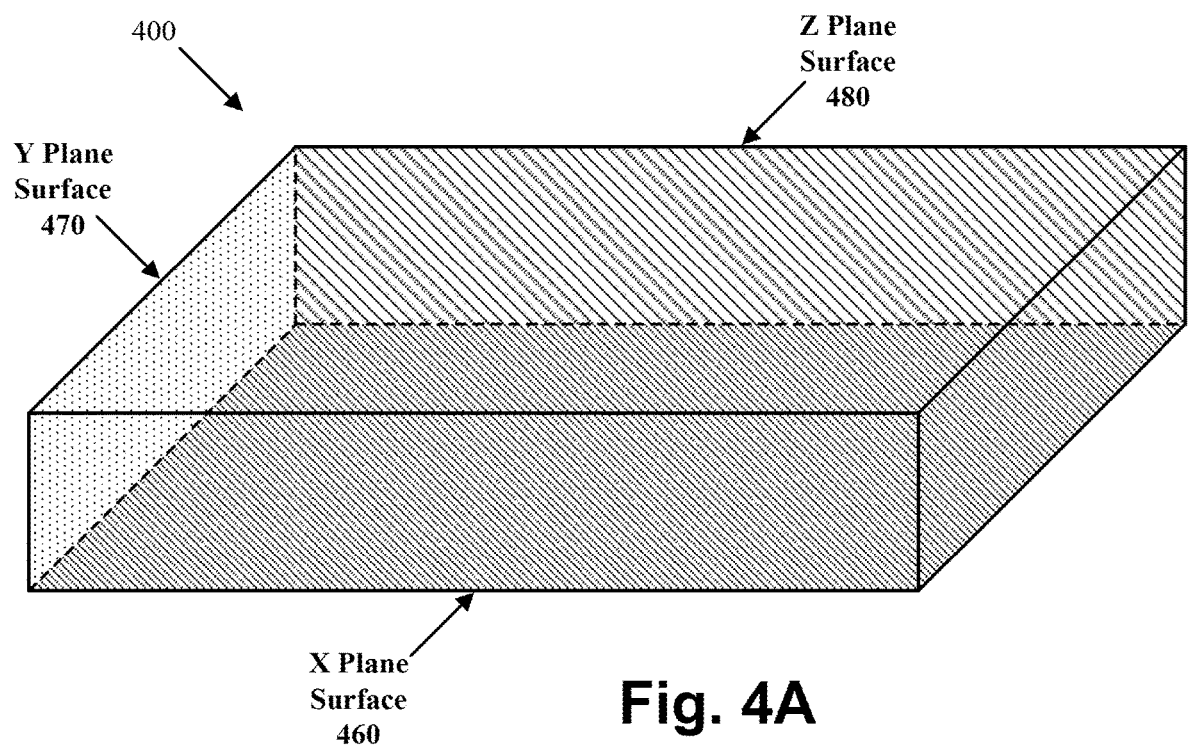
FIG. 4A shows a cuboid MEMS oscillator that can be used in various implementations of the present application.
Figure 4B:
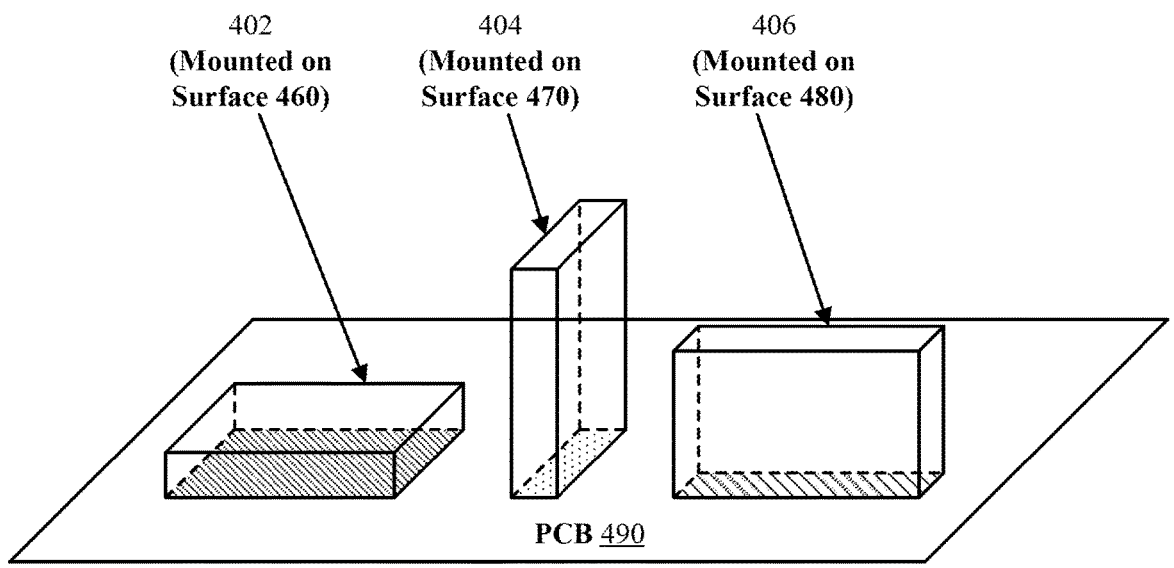
FIG. 4B shows cuboid MEMS oscillators mounted in different orientations on a printed circuit board.

FIGS. 4A and 4B illustrate a technique directed to correcting or reducing errors due to tilt. Tilt errors may occur in individual MEMS oscillators since MEMS oscillators employ mechanical elements, such as support pillars, membranes, and cavities, that are not symmetrical with respect to their placement, shape, size and orientation, and which may also be situated in different planes. Thus, when a MEMS oscillator undergoes a change in tilt or experiences an acceleration due to gravity or other acceleration force, its oscillation frequency may change due to reliance on mechanical elements in the MEMS oscillator. According to the present application, to correct or reduce frequency errors due to tilt or acceleration that are typically correlated in clusters of MEMS oscillators that are on the same PCB or in the same package, each MEMS oscillator is mounted in a different orientation.

FIG. 4A shows cuboid MEMS oscillator 400 that, in the example shown, has an X plane surface 460, Y plane surface 470, and Z plane surface 480. FIG. 4B shows three instances of cuboid MEMS oscillators 400 shown as MEMS oscillator 402 that is mounted on its X plane surface 460 on PCB 490, MEMS oscillator 404 that is mounted on its Y plane surface 470 on PCB 490, and MEMS oscillator 406 that is mounted on its Z plane surface 480 on PCB 490.

The implementation in FIG. 4B or a similar implementation with clusters of three or more MEMS oscillators causes oscillation frequency differences and errors between the MEMS oscillators to be uncorrelated or have reduced correlation. As such, arranging clusters of oscillators with different spatial orientations as shown in FIG. 4B results in effective removal of errors and a significant improvement in the accuracy of clock output 140 produced by oscillator 120, or clock output 240 produced by oscillator 220, or clock output 340 produced by oscillator 320. In other implementations, the different MEMS oscillators are mounted on two PCBs instead of one PCB, wherein one PCB is inserted horizontally in a supporting mother board, while the other PCB is inserted vertically in the same mother board. Other variations and packaging techniques can be used to result in a varied physical orientation of the MEMS oscillators with respect to one another, causing a significant reduction of correlated errors in response to gravity or another acceleration force.

Another example of errors in the frequency of each MEMS oscillator that tend to be somewhat correlated is temperature drift. Temperature responses of MEMS oscillators are typically measured in a thermal chamber during manufacturing. Temperature compensation curves are then typically programmed into each MEMS oscillator. However, the oscillators are not perfectly compensated for temperature effects and there is typically some residual temperature dependence in each oscillator. Moreover, the temperature dependence behavior changes after soldering on the PCB.

An effective approach in measuring and characterizing temperature drift is to utilize an external reference signal such as a GPS signal. The GPS signal provides a very accurate reference that can be used to measure the temperature effect in the MEMS oscillators. Using the GPS signal as a reference signal, accurate tables or compensation algorithms to compensate for the temperature drift of each MEMS oscillator can be devised. That is, temperature drift of the MEMS oscillators can be measured dynamically during normal operation as long as the user has access to a GPS signal. Alternatively, temperature drift of the MEMS oscillators can be measured statically during manufacturing in a thermal chamber. Furthermore, the temperature drift of the MEMS oscillators can be measured at the individual oscillator level or at the ensemble level, i.e. for each physical cluster of oscillators.

Figure 5A:
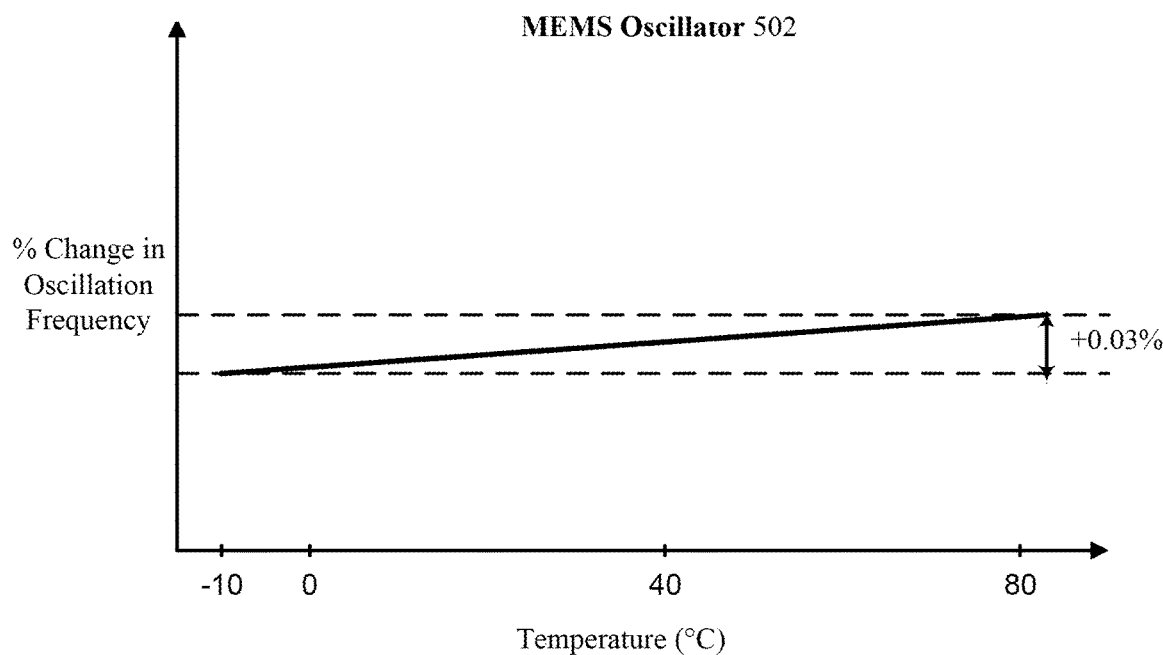
FIG. 5A illustrates one example of a temperature drift of MEMS oscillator (or an ensemble of three or more MEMS oscillators).
Figure 5B:
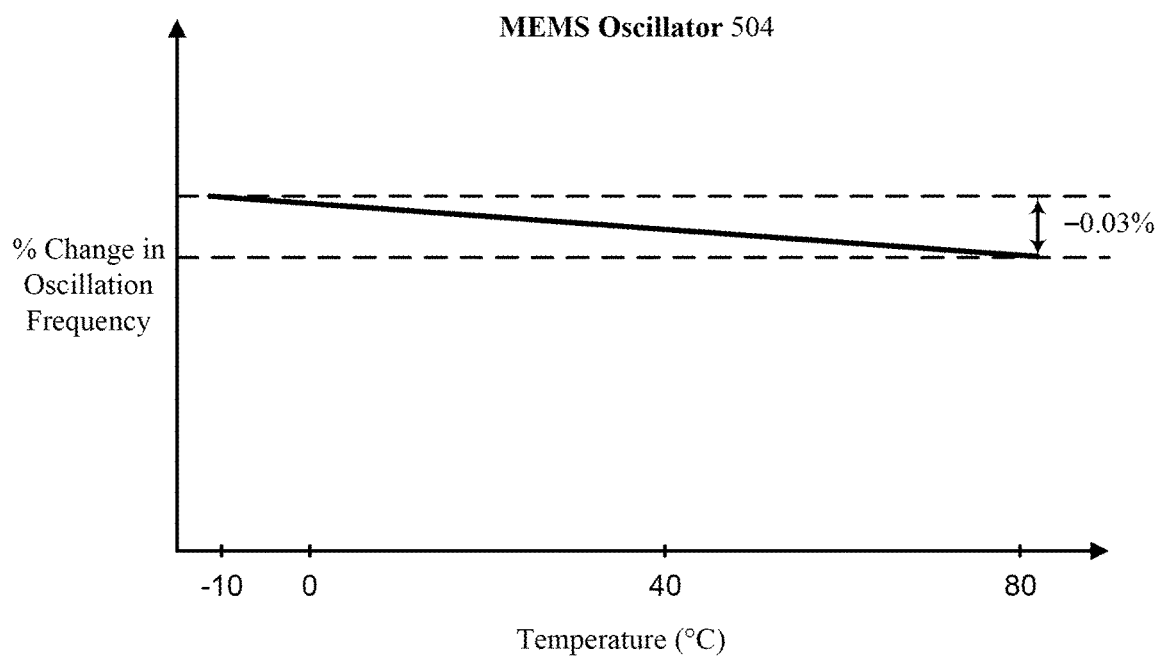
FIG. 5B illustrates another example of a temperature drift of MEMS oscillator (or an ensemble of three or more MEMS oscillators).

FIG. 5A illustrates one example of a temperature drift of MEMS oscillator 502 (or an ensemble of three or more MEMS oscillators 502). As shown in the example of FIG. 5A, MEMS oscillator 502 manifests a +0.03% change in oscillation frequency when the temperature is varied from −10° C. to +80° C. FIG. 5B illustrates another example of a temperature drift of MEMS oscillator 504 (or an ensemble of three or more MEMS oscillators 504). As shown in the example of FIG. 5B, MEMS oscillator 504 manifests a −0.03% change in oscillation frequency when the temperature is varied from −10° C. to +80° C.

Since oscillators (or ensemble of oscillators) 502 and 504 demonstrate frequency errors that are substantially opposite to one another over temperature, these two oscillators can be placed in the same physical or logical cluster of oscillators that compensate each other over temperature variations. Oscillators that show substantially opposite temperature drift characteristics can be matched statically during assembly to be placed in the same cluster, for example of clusters of three or four oscillators. Moreover, ensembles of oscillators (instead of individual oscillators) can be paired statically during assembly to compensate for each other's opposite temperature drift characteristics. The method described above to correct for temperature drift errors applies to implementations in both FIG. 2 (physical clusters of oscillators) and FIG. 3 (logical clusters of oscillators).

Moreover, in the example of FIG. 3, The dynamic configuration of logical clusters of oscillators provides additional flexibility in that it allows for modifying the configuration of the logical clusters based on dynamic measurements of temperature drift in the MEMS oscillators when a GPS signal is available.

A further example of errors in the generated frequency of each MEMS oscillator that tend to be somewhat correlated is age drift. Age drift of the frequency of MEMS oscillators (i.e. error in oscillator frequency due to aging) decelerates over time. However, age drift errors still persist and need to be reduced. In general, the error in a MEMS oscillator's frequency can be measured using GPS as a reference signal, which occurs once every second. That is, the GPS signal is compared to the MEMS oscillator frequency once every second to determine if the oscillator is slow or fast over a span of many days or weeks. For example, in the ensemble of MEMS oscillators shown in FIG. 3, processor 318 determines age drift of MEMS oscillators 301, 302, 303, 304, 305, 306, 307, 308, and 309 by comparing each oscillator's timing with a GPS reference signal. Processor 318 can then reconfigure the logical clusters of oscillators so as to pair three or four oscillators having opposite age drifts such that clock output 340 of controlled MEMS oscillator 320 has a significantly reduced error due to age drift. By way of one example, processor 318 can reconfigure MEMS oscillators 301 through 309 every 48 hours to adjust the frequency of clock output 340 of controlled MEMS oscillator 320.

In the implementation of FIG. 3, processor 318 can be used to manage and conserve power consumed by the nine MEMS oscillators while preserving accuracy of clock output 340. For example, if over a period of two weeks, processor 318 determines that MEMS oscillators 304 and 306 are error-free by determining that the frequency of clock output 340 is identical or closest to frequencies of MEMS oscillators 304 and 306, or by comparing outputs of MEMS oscillators 304 and 306 with a reference GPS signal, then the remaining MEMS oscillators 301, 302, 303, 305, 307, 308, and 309 can be shut down to reduce power consumption without loss of any accuracy in clock output 340. The seven MEMS oscillators 301, 302, 303, 305, 307, 308, and 309 can be powered up once a month to evaluate whether MEMS oscillators 304 and 306 are still error-free in that they are in sync with clock output 340 or with a reference GPS signal and, if so, the seven MEMS oscillators 301, 302, 303, 305, 307, 308, and 309 can be powered down again to reduce power consumption.

Furthermore, if one of the nine MEMS oscillators 301, 302, 303, 304, 305, 306, 307, 308, and 309 consumes too much power as a result of a physical malfunction, that particular oscillator can be shut down without a significant impact on the accuracy of clock output 340.

Using the above-described methods, a low power operation can be achieved. The methods described above to achieve a lower power operation may also be applied to physical clusters of oscillators in the implementation of FIG. 2. In that implementation, one or more individual oscillators or one or more clusters of oscillators can be shut down to conserve power using a procedure similar to what is described above in relation to FIG. 3.

Moreover, the above-described methods can be used to identify a non-performing or slowly failing MEMS oscillator that changes frequency faster than it used to, or has too much frequency offset, and then take it out of the ensemble of MEMS oscillators by, for example, powering down that particular MEMS oscillator.

The above described approaches for increasing accuracy of clock outputs 240 or 340 can be further enhanced by utilizing processor 208 or 318 to assign a different weight to each MEMS oscillator. The different weights can be assigned based on how well and reliably each MEMS oscillator was tested during manufacturing. The better tested MEMS oscillators would receive a greater weight from processor 208 or 318. In addition, or instead of this static weighting technique, processor 208 or 318 can dynamically assign a weight to each MEMS oscillator based on a statistical analysis of errors over many days. Kalman filtering or Bayesian particle filtering can also be used to apply accurate weighting to each oscillator based on probability of error, and the Kalman filter or the Bayesian particle filter thus outputs an accurate weighted average to control MEMS oscillator 220 in FIG. 2 or MEMS oscillator 320 in FIG. 3 to reduce error in clock output 240 or clock output 340. Moreover, the Kalman filtering or the Bayesian particle filtering can be combined with a compensation table to compensate for temperature drift and age drift.

Other methods, such as those disclosed in U.S. Pat. No. 8,988,151 entitled "Method and apparatus to improve performance of GPSDO's and other oscillators," issued on Mar. 24, 2015, can be combined with the above-disclosed methods to correct the frequency of a MEMS oscillator in the ensemble of MEMS oscillators. For example, U.S. Pat. No. 8,988,151 discloses methods such as establishing an operating baseline for a crystal oscillator using a frequency reference, storing information in memory corresponding to the operating baseline, and adjusting the frequency according to the stored information. Adjusting the frequency can also be performed in response to a power-on event and in the absence of the frequency reference. The entire disclosure and content of U.S. Pat. No. 8,988,151 is hereby incorporated by reference into the present application.

Figure 6:
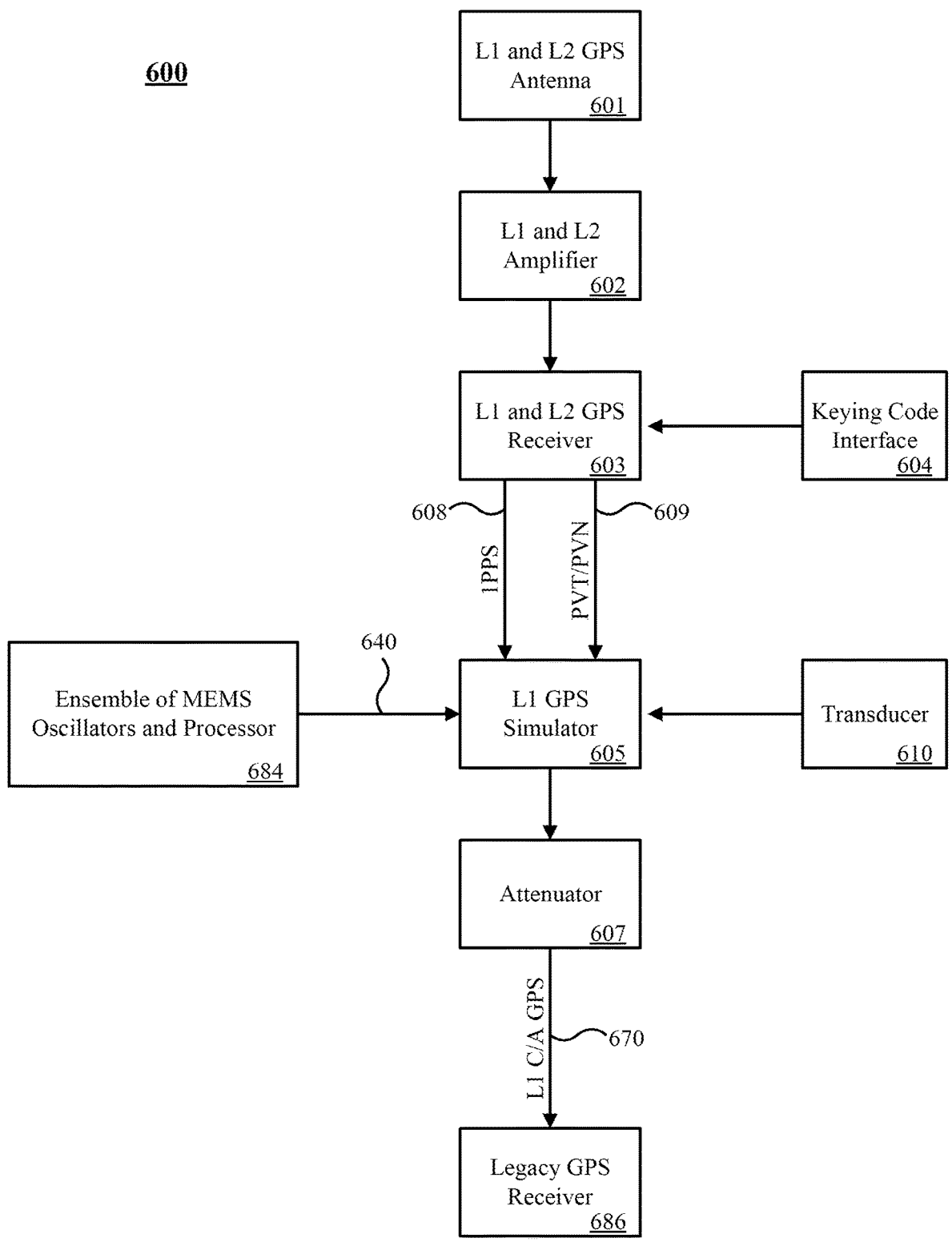
FIG. 6 illustrates an apparatus utilized to retrofit a legacy GPS receiver utilizing an ensemble of MEMS oscillators and a processor according to one implementation of the present application.

The above-described techniques for using MEMS oscillators in physical or logical clusters outperform atomic clocks in ordinary conditions and even under strains of temperature drift and age drift. One of many applications of the clock system described above is in, for example, retrofitting legacy Global Positioning Satellite (GPS) receivers. FIG. 6 illustrates apparatus 600 utilized to retrofit legacy GPS receiver 686. Apparatus 600 includes L1 and L2 GPS antenna 601, L1 and L2 amplifier 602, L1 and L2 GPS receiver 603, keying code interface 604, L1 GPS simulator 605, clock system 684, that is an ensemble of MEMS oscillators and processor such as those shown and described in relation to FIG. 2 or FIG. 3, clock output 640 corresponding to clock output 240 in FIG. 2 or clock output 340 in FIG. 3, and attenuator 607. Apparatus 600 may be used to retrofit existing legacy GPS receiver 686 to translate L1 and L2 military signals into a simulated L1 commercial signal that legacy GPS receiver 686 may process. The translation of L1 or L2 may be in response to available secret keying information provided at keying code interface 604.

Apparatus 600 receives a signal at L1 and L2 GPS antenna 601. Antenna 601 may receive encrypted P (Y) military code having carrier frequencies L1 and L2. Amplifier 602 is coupled to receive L1 and L2 GPS signals from antenna 601. L1 and L2 GPS receiver 603 is coupled to receive the amplified L1 and L2 GPS signals from amplifier 602. L1 and L2 GPS receiver 603 produces a one pulse per second (1 PPS) signal at output 608 and a position-velocity-timing and/or position-navigation-timing (PVT/PNT) signal at output 609 from either L1 or L2. Keying code interface 604 accepts keying code information that controls whether L2 GPS signals are processed. The default may be that only L1 signals are processed when the keying code is absent. L1 GPS simulator 605 receives the 1 PPS and PVT/PNT signals and outputs a simulated (transcoded) L1 GPS signal. Attenuator 607 is coupled to receive the simulated L1 GPS signal from simulator 605 and attenuate the signal enough so that legacy GPS receiver 686 processes the signal as a normal L1 C/A GPS signal 670.

Transducer (sensor) 610 is coupled to simulator 605 to provide alternate input regarding speed, position, and/or direction. Transducer 610 may be a gyro, a magnetometer, an accelerometer, celestial sensor, geo-mapping sensor, 3D RADAR sensor, EO/IR, or any collection of transducers. Transducer 610 may be used to provide inertial navigation in conjunction with clock system 684.

Clock system 684, that is ensemble of MEMS oscillators and processor such as those shown and described in relation to FIG. 2 or FIG. 3 may be used to generate a calculated timing when the L1 and L2 signal are not available or denied. Clock system 684 may also be used in inertial navigation systems. Since clock system 684 is utilized when L1 and L2 GPS signals are not available or denied, output clock 640 must be extremely accurate and error-free in order for apparatus 600 to accurately and reliably generate the normal L1 C/A GPS signal 670. As described above, clock system 684 provides a low cost and extremely accurate clock output 640 that is suitable for a variety of applications requiring extreme accuracy and low cost, such as that in apparatus 600 utilized for retrofitting legacy GPS receiver 686. The above-discussed apparatus 600 for retrofitting legacy GPS receiver 686, as well as other examples of uses of a highly accurate oscillator in systems utilized to retrofit legacy GPS receivers (and in general GNSS receivers) are disclosed in detail in the U.S. Pat. No. 10,809,384 filed on Feb. 9, 2017 and titled "Method and apparatus to retrofit legacy global positioning satellite (GPS) and other global navigation satellite system (GNSS) receivers." The entire content and disclosure of that patent is hereby incorporated fully by reference into the present application. Manifestly, use of clock system 684 in apparatus 600 for retrofitting a legacy GPS receiver is only one of numerous non-exhaustive examples in which low cost and extreme accuracy of clock is critical.

In addition to the advantages discussed above, MEMS oscillators have several advantages over Chip Scale Atomic Clocks (CSAC). For example, even if nine MEMS oscillators are integrated in a package, the height of the package can still be less than the height of the CSAC module that is being replaced. Another advantage of MEMS oscillators is their extreme acceleration survivability. The MEMS oscillators can survive an acceleration force of up to 20,000 g's or 30,000 g's, whereas a CSAC typically cannot handle more than 500 g. In one application, this extreme acceleration survivability enables MEMS oscillators to be launched inside an artillery shell and help navigate (steer) the shell and time the explosion. Furthermore, MEMS oscillators can function in a wide temperature range of from −40° C. to +105° C. In contrast, CSACs are typically limited to −20° C. to +85° C.

The present application has disclosed various exemplary implementations that result in clock systems with accuracy exceeding that of many atomic clocks while being less expensive and more resilient than atomic clocks. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A clock system for generating an error-reduced clock output, said clock system comprising:
a plurality of physical clusters of MEMS oscillators, each of said plurality of physical clusters configured as a predetermined grouping;
of MEMS oscillators providing a set of associated-clock inputs to a respective one of a plurality of input modules of a processor;
said processor using said plurality of input modules to apply a first error correction technique to each said set of clock inputs to generate a plurality of interim clock outputs, each said interim clock output corresponding to one of said plurality of physical clusters of MEMS oscillators;
said processor applying a second error correction technique to said plurality of interim clock outputs to generate an oscillator control output;
said oscillator control output adjusting a frequency of a controlled MEMS oscillator to generate said error-reduced clock output.

2. The clock system of claim 1, wherein at least one of said plurality of physical clusters of MEMS oscillators is configured as a three-cornered hat.

3. The clock system of claim 1, wherein each of said plurality of physical clusters of MEMS oscillators is configured as a three-cornered hat.

4. The clock system of claim 1, wherein each of said plurality of physical clusters of MEMS oscillators comprises at least three MEMS oscillators.

5. The clock system of claim 1, wherein one or both of said first and second error correction techniques comprise a root mean square error (RMSE) correction technique.

6. The clock system of claim 1, wherein one or both of said first and second error correction techniques comprise a Kalman filtering error correction technique or a Bayesian particle filtering method.

7. The clock system of claim 1, wherein said MEMS oscillators are situated in each said plurality of physical clusters according to each MEMS oscillator's temperature drift characteristics.

8. The clock system of claim 1, wherein said MEMS oscillators are mounted in different orientations on a printed circuit board to reduce frequency error due to tilt or acceleration.

9. The clock system of claim 1, wherein said error-reduced clock output is utilized in a GPS receiver.

10. The clock system of claim 1, wherein said error-reduced clock output is utilized to retrofit a legacy GPS receiver.

11. A clock system for generating an error-reduced clock output, said clock system comprising:
a plurality of MEMS oscillators;
each of said plurality of MEMS oscillators providing a clock input to a processor;
said processor configuring said plurality of MEMS oscillators into a dynamic plurality of logical clusters of MEMS oscillators such that each of said dynamic plurality of logical clusters of MEMS oscillators includes individual MEMS oscillators having substantially opposite respective oscillation drift characteristics;
said processor applying an error correction technique to said dynamic plurality of logical clusters of MEMS oscillators to generate an oscillator control output;
said oscillator control output adjusting a frequency of a controlled MEMS oscillator to generate said error-reduced clock output.

12. The clock system of claim 11, wherein said processor configures at least one of said dynamic plurality of logical clusters of MEMS oscillators as a three-cornered hat.

13. The clock system of claim 11, wherein said processor configures each of said dynamic plurality of logical clusters of MEMS oscillators to comprise at least three MEMS oscillators.

14. The clock system of claim 11, wherein said error correction technique comprises a root mean square error (RMSE) correction technique.

15. The clock system of claim 11, wherein said error correction technique comprises a Kalman filtering error correction technique or a Bayesian particle filtering method.

16. The clock system of claim 11, wherein said processor configures said dynamic plurality of logical clusters of MEMS oscillators according to each MEMS oscillator's temperature drift characteristics.

17. The clock system of claim 11, wherein said processor determines age drift characteristics of each of said plurality of MEMS oscillators and configures said dynamic plurality of logical clusters of MEMS oscillators according to each MEMS oscillator's age drift.

18. The clock system of claim 11, wherein said plurality of MEMS oscillators are mounted in different orientations on a printed circuit board to reduce frequency error due to tilt or acceleration.

19. The clock system of claim 11, wherein said error-reduced clock output is utilized in a GPS receiver.

20. The clock system of claim 11, wherein said error-reduced clock output is utilized to retrofit a legacy GPS receiver.

* * * * *